United States Patent
Kim

(10) Patent No.: US 8,623,723 B2
(45) Date of Patent: Jan. 7, 2014

(54) METHOD FOR MANUFACTURING A SEMICONDUCTOR DEVICE WITH A BIT LINE CONTACT HOLE

(75) Inventor: Do Hyung Kim, Suwon (KR)

(73) Assignee: Hynix Semicondutor Inc., Icheon (KR)

( * ) Notice: Subject to any disclaimer, the term of this patent is extended or adjusted under 35 U.S.C. 154(b) by 0 days.

(21) Appl. No.: 13/494,923

(22) Filed: Jun. 12, 2012

(65) Prior Publication Data

US 2012/0264298 A1 Oct. 18, 2012

Related U.S. Application Data

(62) Division of application No. 12/981,204, filed on Dec. 29, 2010, now Pat. No. 8,216,897.

(30) Foreign Application Priority Data

Apr. 19, 2010 (KR) .................. 10-2010-0035733

(51) Int. Cl.
*H01L 21/8242* (2006.01)
*H01L 21/336* (2006.01)

(52) U.S. Cl.
USPC .......................................... 438/239; 438/262

(58) Field of Classification Search
USPC .......... 438/239, 262, 282, 381; 257/E21.008, 257/E26.646
See application file for complete search history.

(56) References Cited

U.S. PATENT DOCUMENTS

| | | | |
|---|---|---|---|
| 6,222,244 B1 * | 4/2001 | Arndt et al. .................. | 257/529 |
| 2008/0253160 A1 * | 10/2008 | Popp et al. ...................... | 365/72 |
| 2009/0085083 A1 | 4/2009 | Shin | |
| 2011/0070716 A1 * | 3/2011 | Kim .............................. | 438/386 |
| 2012/0012912 A1 * | 1/2012 | Kwon .......................... | 257/302 |

FOREIGN PATENT DOCUMENTS

| | | |
|---|---|---|
| KR | 1020070082674 A | 8/2007 |
| KR | 1020080060364 A | 7/2008 |
| KR | 1020090034171 A | 4/2009 |

* cited by examiner

*Primary Examiner* — Kevin Parendo

(57) ABSTRACT

A method for manufacturing a semiconductor device is disclosed. A method for manufacturing a semiconductor device includes forming a device isolation structure for defining an active region, forming a buried word line traversing the active region, forming one or more insulation film patterns over the buried word line, forming a line pattern including a first conductive material at a position between the insulation film patterns, and forming a plurality of storage node contacts (SNCs) by isolating the line pattern. As a result, when forming a bit line contact and a storage node contact, a fabrication margin is increased.

6 Claims, 7 Drawing Sheets

METHOD FOR MANUFACTURING A SEMICONDUCTOR DEVICE WITH A BIT LINE CONTACT HOLE

CROSS-REFERENCE TO RELATED APPLICATION

This application is a divisional of U.S. patent application Ser. No. 12/981,204, filed on Dec. 29, 2010, which claims the priority of Korean patent application No. 10-2010-0035733 filed on 19 Apr. 2010, the disclosure of which is hereby incorporated in its entirety by reference.

BACKGROUND OF THE INVENTION

Embodiments of the present invention relate to a method for manufacturing a highly-integrated semiconductor device, and more particularly to a contact that enables the highly-integrated semiconductor device to be stably operated, and a method for manufacturing the contact.

Generally, a semiconductor is a material that has an electrical conductivity that falls in an intermediate region between a conductor and a nonconductor. Although the semiconductor is similar to a nonconductor in a pure state, the conductivity of the semiconductor device may be increased by doping or other manipulation. The semiconductor is used to form a semiconductor device such as a transistor through doping and various deposition and removal processes. An example of the semiconductor device is a semiconductor memory device. The semiconductor memory device includes a variety of constituent elements such as a transistor, a capacitor, etc. Such elements are interconnected through a contact, so that electrical signals can be passed between them. The semiconductor memory device has been rapidly developed to reduce power consumption as well as increase the read/write speed.

As a design rule is reduced to 100 nm or less so as to increase the integration degree of the semiconductor memory device, a cross-sectional area occupied by constituent elements of the semiconductor memory device is reduced, resulting in various problems. For example, a channel length of the transistor is shortened so that a short channel effect such as a punch-through occurs. When forming a contact, an alignment error is increased so that contact resistance is also increased. As spacing between neighboring constituent elements is gradually reduced, it becomes difficult to electrically insulate between the constituent elements. As a result electrical interference caused by parasitic capacitance and the like is increased, so that operation stability and reliability of the semiconductor memory device is reduced.

In recent times, as the integration degree of the semiconductor device is increased, an active region is reduced in size. For example, in a fabrication process of 40 nm or less in an 8 $F^2$ structure, a process for forming a device isolation region defining the active region is also becoming difficult. In addition, as the width of a gate pattern is gradually reduced, an aspect ratio of the gate pattern is increased, resulting in a defect such as a leaning of gate pattern. In addition, from the viewpoint of a gate pattern, if the degree of overlap is increased because of an alignment error encountered between a recess region formed when a trench formed in an active region is buried and a pattern formed over the active region occurs, various problems may arise (for example, increase in resistance, reduction in fabrication margin for contact formation, etc.).

As the degree of integration increases, the contact size needs to decrease. If a small-sized contact is formed, resistance is increased, so that an operation for reading and writing data from and in a unit cell may not be smoothly carried out. In order to guarantee a fabrication margin for contact formation, a buried gate structure may be used, but an unexpected problem between a bit line and a storage electrode contact may be encountered.

In the case of a 6 $F^2$-structured cell region including a plurality of unit cells in a semiconductor memory device, spacing between neighbor constituent elements is very small and an overlap margin is reduced. This makes it more difficult for a fabrication process for coupling a storage node contact (SNC) and a bit line contact (BLC) to active regions located at both sides of a gate pattern. In addition, if a fabrication error occurs because the spacing between the SNC and the BLC becomes smaller, the possibility for causing an electrical short between the SNC and the BLC is very high. In order to prevent an electrical short between the SNC and the BLC, an insulation film is heavily formed at the sidewalls of the SNC and the BLC, resulting in an increased fabrication margin.

However, assuming that the insulation film is heavily formed at the sidewalls of the SNC and the BLC, there arise a variety of shortcomings. Some example shortcomings are a reduction in an overlap margin that enables the SNC and the BLC to be coupled to the active region and an increased resistance caused by a reduction in overlap degree between the SNC and the active region. In order to increase the size of a contact region, a method for forming a contact by partially etching some parts of the active region may be used. However, the aforementioned method also has a disadvantage in that the depth of a junction part of electric charges is increased when the electric charges are stored in a storage electrode, so that an overlap part between the storage electrode and the channel region is increased. In conclusion, a gate induced drain leakage (GIDL) is increased, and a channel length is reduced, resulting in deterioration of the operation characteristics of the semiconductor device.

BRIEF SUMMARY OF THE INVENTION

Various embodiments of the present invention are directed to providing a method for manufacturing a semiconductor device that substantially obviates one or more problems due to limitations and disadvantages of the related art.

An object of the present invention is to provide a semiconductor device for increasing a fabrication margin when a bit line contact and a storage node contact are formed.

In accordance with an aspect of the present invention, a method for manufacturing a semiconductor device includes forming a device isolation structure for defining an active region, forming a buried word line crossing the active region, forming one or more insulation film patterns over the buried word line, forming a line pattern including a first conductive material at a position between the insulation film patterns, and forming a plurality of storage node contacts by isolating the line pattern.

The active region may have a size and a shape corresponding to those of a 6 $F^2$-sized unit cell.

In the forming of the buried word line, the word line may be formed to be orthogonal to a major-axis direction of the active region.

The forming of the one or more insulation film patterns may include forming an insulation film over the active region and the buried word line, and removing the insulation film contained in the remaining regions other than an upper part of the buried word line.

The insulation film pattern may include a plurality of insulation layers, and include an etch stop film that includes a nitride film located between the insulation layers, each of which includes an oxide film.

The line pattern may be isolated in a direction orthogonal to the buried word line, so that the storage node contact is formed in an island pattern.

The forming of the plurality of storage node contacts by isolating the line pattern may include depositing a hard mask film over the line pattern, patterning the hard mask film in a direction orthogonal to the buried word line, forming a trench by using the patterned hard mask film as an etch mask, forming a nitride film in the trench, and burying the trench by depositing an oxide film over the nitride film.

The method may further include forming a bit line contact hole over the active region, forming one or more spacers at sidewalls of the bit line contact hole, forming a bit line contact by burying a second conductive material in a position between the spacers, and forming a bit line over the bit line contact.

In the forming of the bit line contact, the storage node contacts may be partially etched and thus exposed.

The spacers include a nitride film.

Each of the first and second conductive materials include polysilicon.

The storage node contact may be disposed in a cell region and may have the same height as that of a gate pattern disposed in a peripheral region.

The bit line contact may be disposed in the cell region, and may be higher than the storage node contact in height.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts. A semiconductor device and a method for manufacturing the same according to embodiments of the present invention will hereinafter be described with reference to the accompanying drawings.

In accordance with the following embodiments of the present invention, a contact area between each of a bit line contact (BLC) and a storage node contact (SNC) contained in a semiconductor memory device and an active region can be increased, and the SNC and the BLC can be electrically isolated from neighbor constituent elements. A semiconductor device and a method for manufacturing the same according to the embodiments of the present invention will hereinafter be described with reference to the accompanying drawings.

FIGS. 1 to 7 are cross-sectional views and plan views illustrating a method for manufacturing a semiconductor device according to embodiments of the present invention. In more detail, FIGS. 1 to 7 are cross-sectional views and plan views illustrating a cell region of a semiconductor memory device, and also include cross-sectional views illustrating a peripheral region corresponding to a cell region. In addition, a case in which a unit cell formed in the cell region has a 6 $F^2$ size will be described below.

Figure 1:
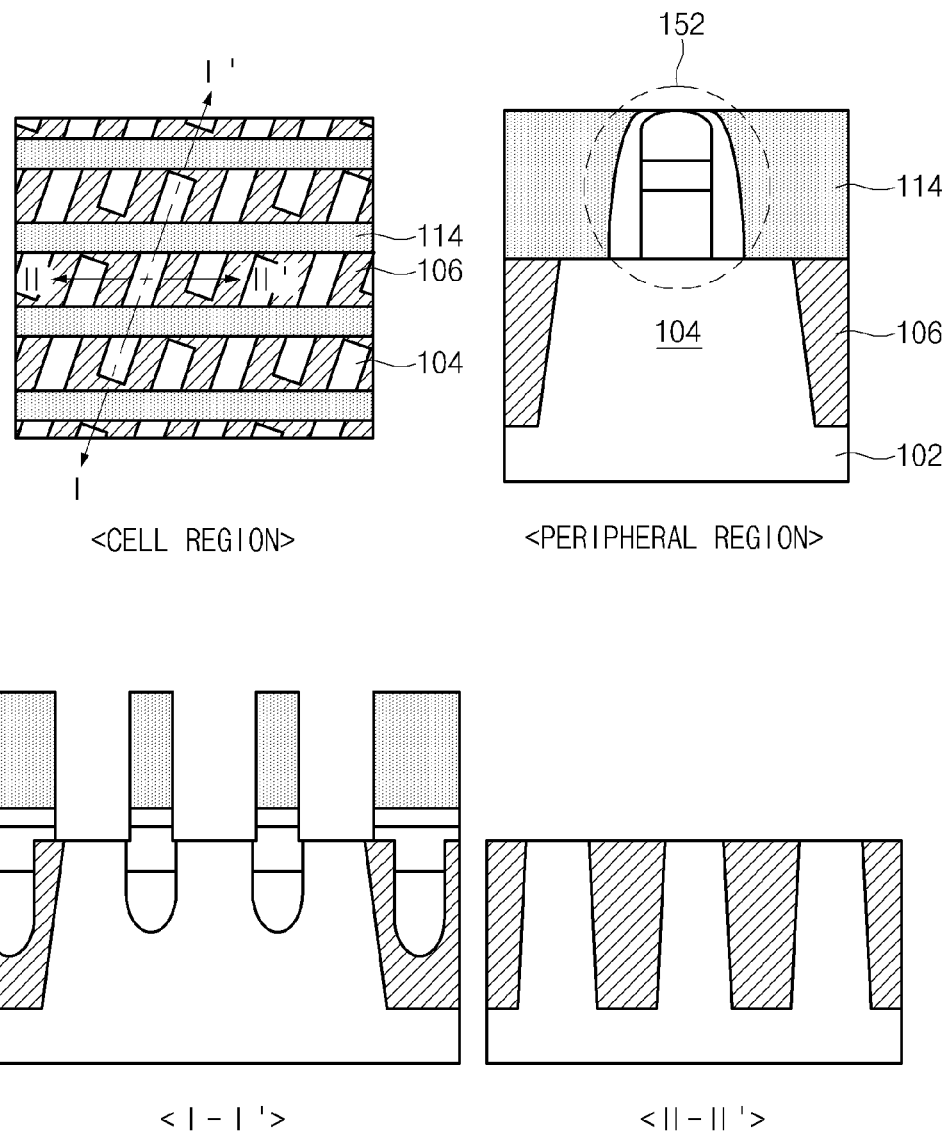
FIGS. 1 to 7 are cross-sectional views and plan views illustrating a method for manufacturing a semiconductor device according to embodiments of the present invention.

Referring to FIG. 1, a device isolation region 106 for defining an active region 104 is formed over a semiconductor substrate 102.

Thereafter, a recess (not shown) traversing the active region 104 is formed in the cell region, a conductive material is buried in a lower part of the recess, a buried gate 108 is formed, and a first insulation film 110 is buried in an upper part of the recess. A second insulation film 112 is deposited over the first insulation film 110.

A gate pattern 152 is formed over the active region 104 in a peripheral region. In this case, the gate pattern may include a lower gate electrode, an upper gate electrode, a gate hard mask film, and a sidewall spacer.

A third insulation film 114 is deposited over the second insulation film 112, the active region 104 of the peripheral region, and the gate pattern 152, and is then planarized to the height of the gate pattern 152.

In this case, each of the first insulation film 110 and the third insulation film 114 includes an oxide film, and the second insulation film 112 includes a nitride film. The second insulation film 112 has an etch selection ratio different from those of the first and third insulation films 110 and 114, so that it can serve as an etch stop layer for use in an etch process for forming a contact.

In order to expose the active region 104 formed at both sides of a line-type recess for forming the buried gate 108, first to third insulation films 110, 112 and 114 deposited between neighbor recesses are etched. The present invention exposes not only the region in which the SNC or the BLC is formed but also some parts of the device isolation region and thus the first to third insulation films 110, 112 and 114 remain only on the buried gate 108, whereas the related art forms a contact hole using a mask that defines only a region in which the SNC or the BLC is formed.

Figure 2:
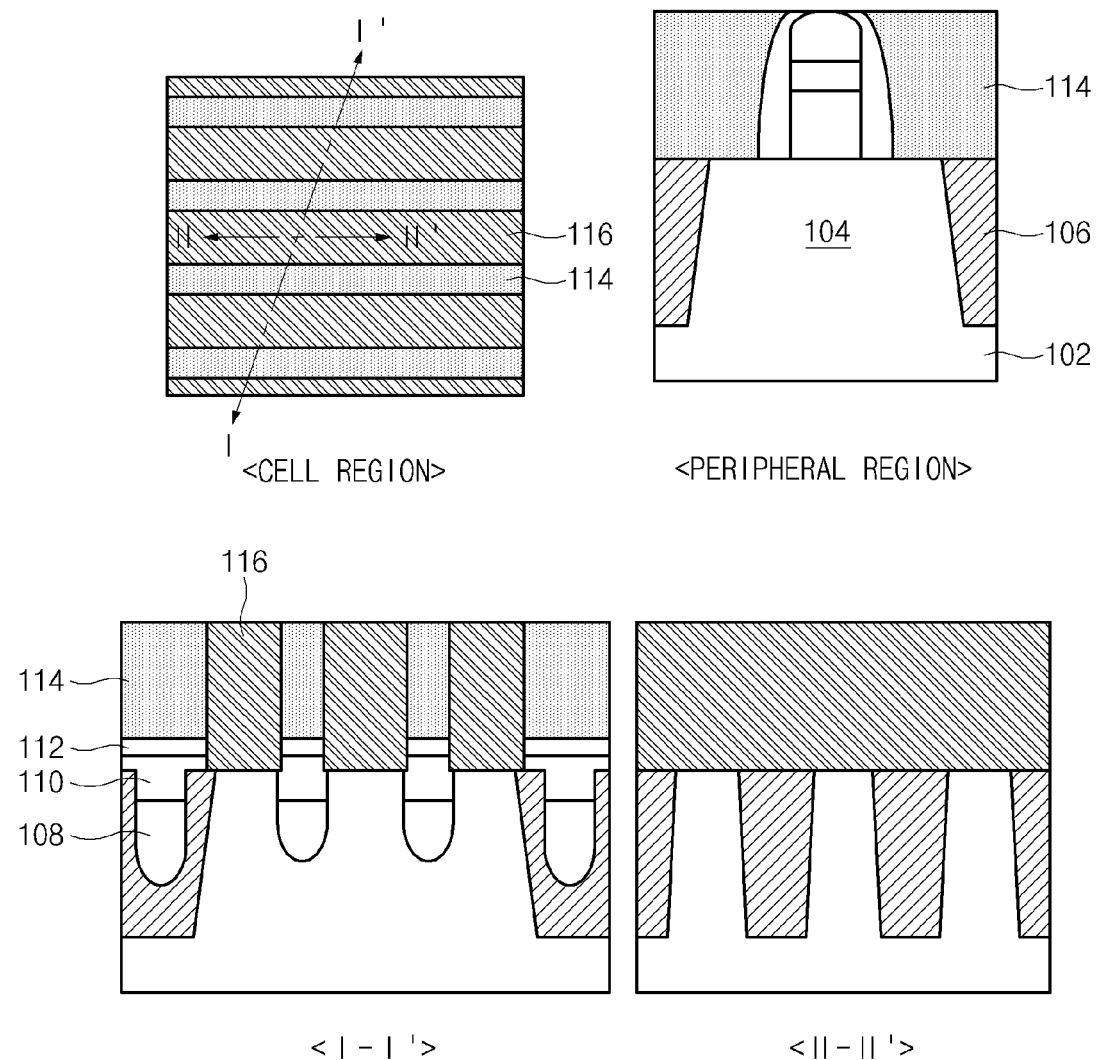

Referring to FIG. 2, a conductive material 116 is deposited over the active region 104 and the device isolation region 106 exposed by the patterned first to third insulation films 110, 112 and 114 that remain on the buried gate 108. The conductive material 116 is then planarized to expose the top surface of the third insulation film 114.

Figure 3:
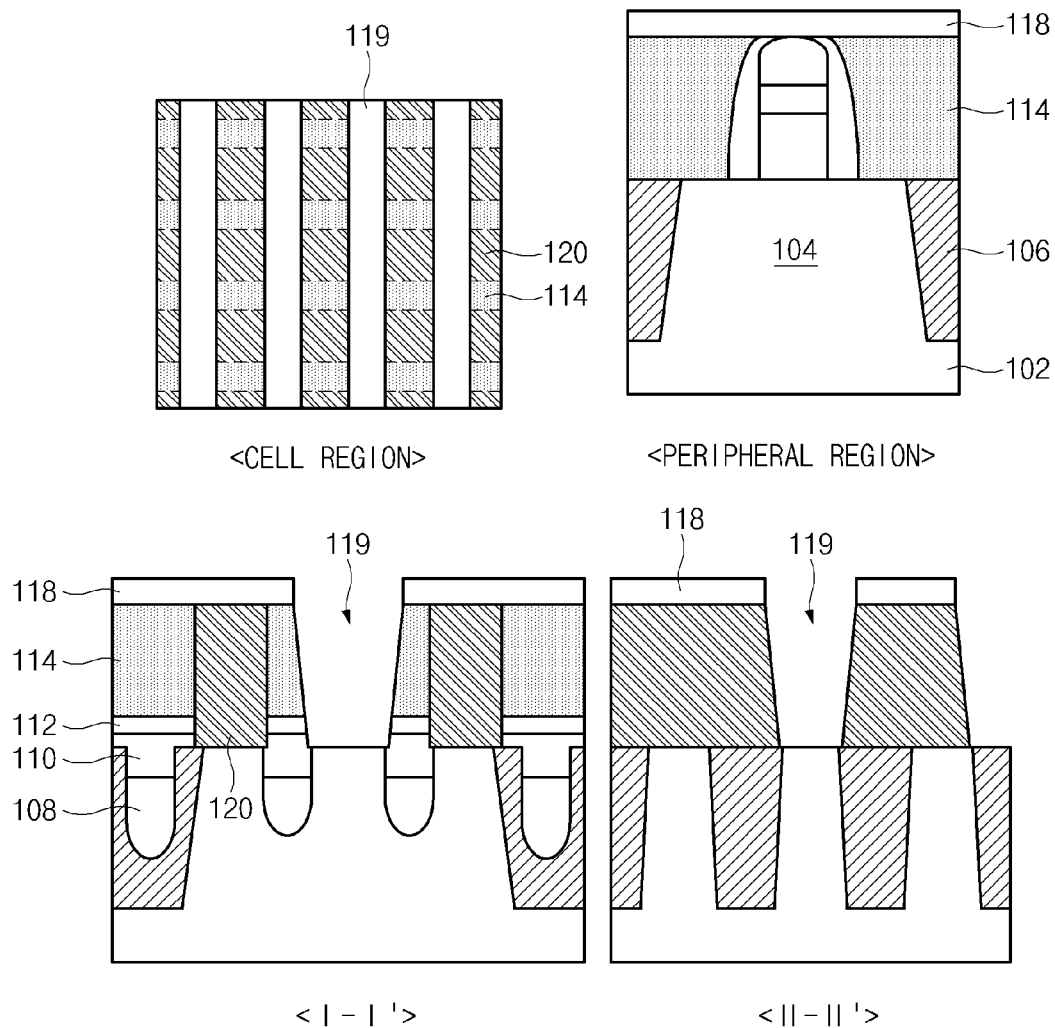

Referring to FIG. 3, a first hard mask film 118 is deposited over the third insulation film 114 and the conductive material 116, and is then patterned, so that the SNC is formed and the conductive material 116 is isolated. In this case, the first hard mask film 118 is formed in a line pattern orthogonal to the buried gate 108.

In FIG. 2, the conductive material 116 is formed in a horizontal line pattern among neighboring buried gates 108. The conductive material 116 exposed by the vertically-patterned first hard mask film 118 shown in FIG. 3 is removed, and the trench 119 is formed, so that the island-pattern SNC 120 is formed.

Generally, the related art forms a contact hole exposing the active region, fills a conductive material in the contact hole, and thus forms the SNC. In contrast, the present invention forms a line-pattern conductive layer instead of a contact hole pattern, and forms the island-pattern SNC using the line-pattern etch mask defined in a crossing direction. In comparison with the formation of the contact hole pattern, formation of the line pattern can further increase a fabrication margin of the present invention.

In addition, the formation of the contact hole pattern according to the related art may increase junction resistance between a source/drain region and an SNC under the condition that an overlap margin between an active region and a contact hole pattern is reduced due to an alignment error and the like. However, the present invention forms a line-pattern conductive layer that exposes not only an active region coupled to the SNC but also the device isolation region located between active regions, patterns the line-pattern conductive layer in an island form, and thus prevents a defect encountered when the contact hole pattern is formed.

Figure 4:
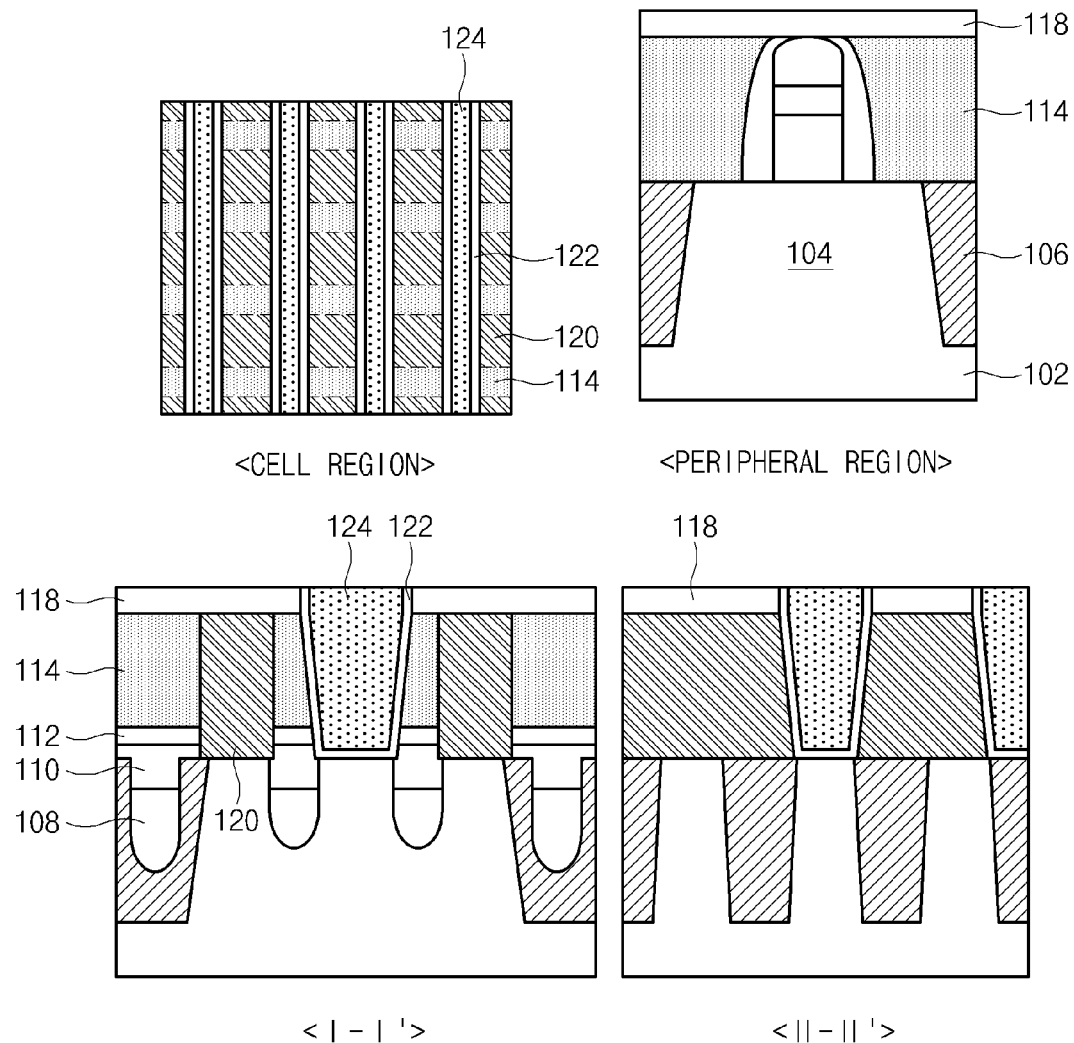

Referring to FIG. 4, a fourth insulation film 122 is formed in the exposed trench 119 of the island-pattern SNC 120. In this case, the fourth insulation film 122 may be formed of a liner nitride film formed in a cell region and a peripheral region. Thereafter, a fifth insulation film 124 is deposited over the fourth insulation film 122 so that the trench 119 formed by an etch process forming the SNC 120 is buried. The resultant fifth insulation film 124 formed by the buried trench 119 is planarized until the first hard mask film 118 is exposed. In this case, the fifth insulation film 124 may be formed of an oxide film.

Figure 5:
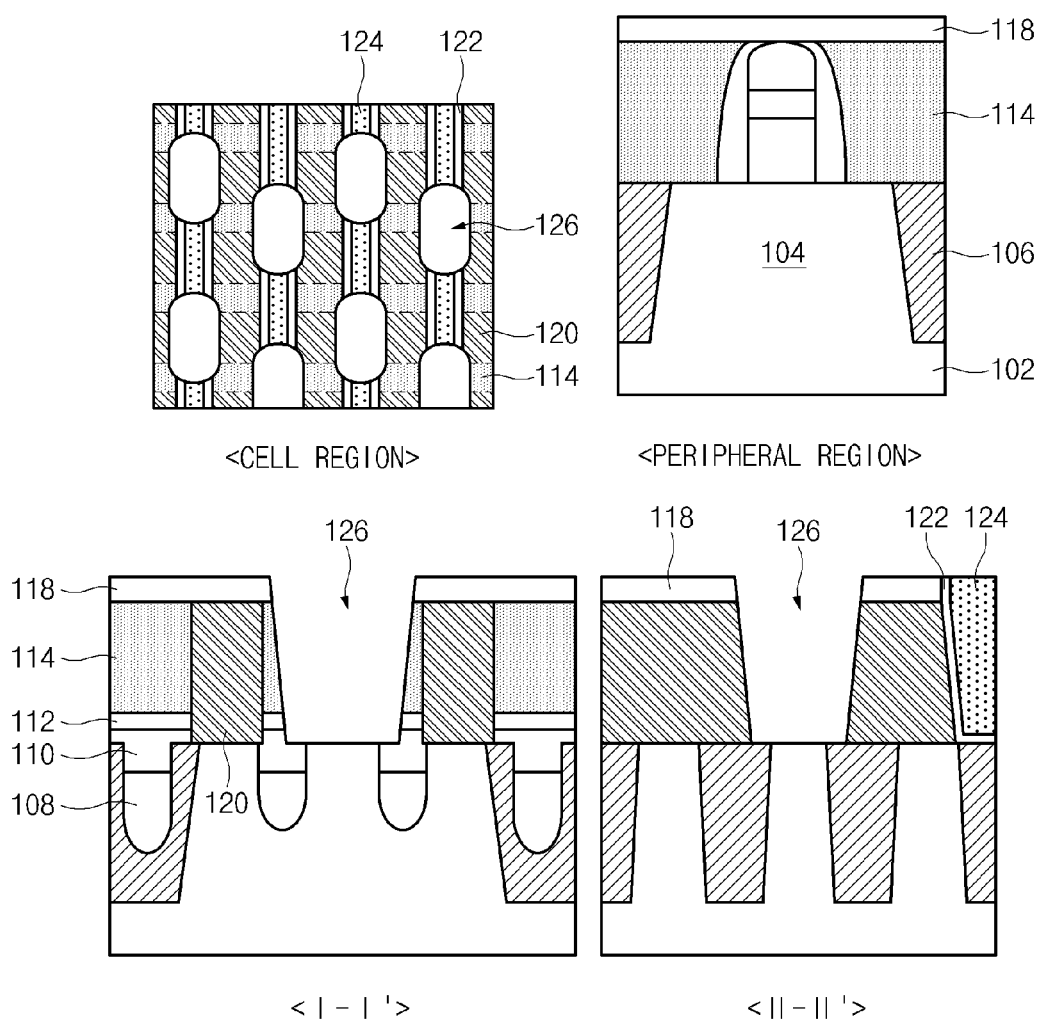

Referring to FIG. 5, an etch process is performed using a mask defining the BLC position, so that the bit line contact hole 126 is formed. In this case, a critical dimension of the BLC 126 may be larger than that of the line pattern formed when the SNC 120 is formed. Not only parts of the fifth insulation film 124 but also parts of the SNC 120 may be etched. In this case, since the SNC 120 is larger than the source/drain regions formed on the top surface of the active region 104, junction resistance of the SNC 120 is not increased although the bit line contact hole 126 is formed to be large in size and the SNC 120 is partially etched.

Figure 6:
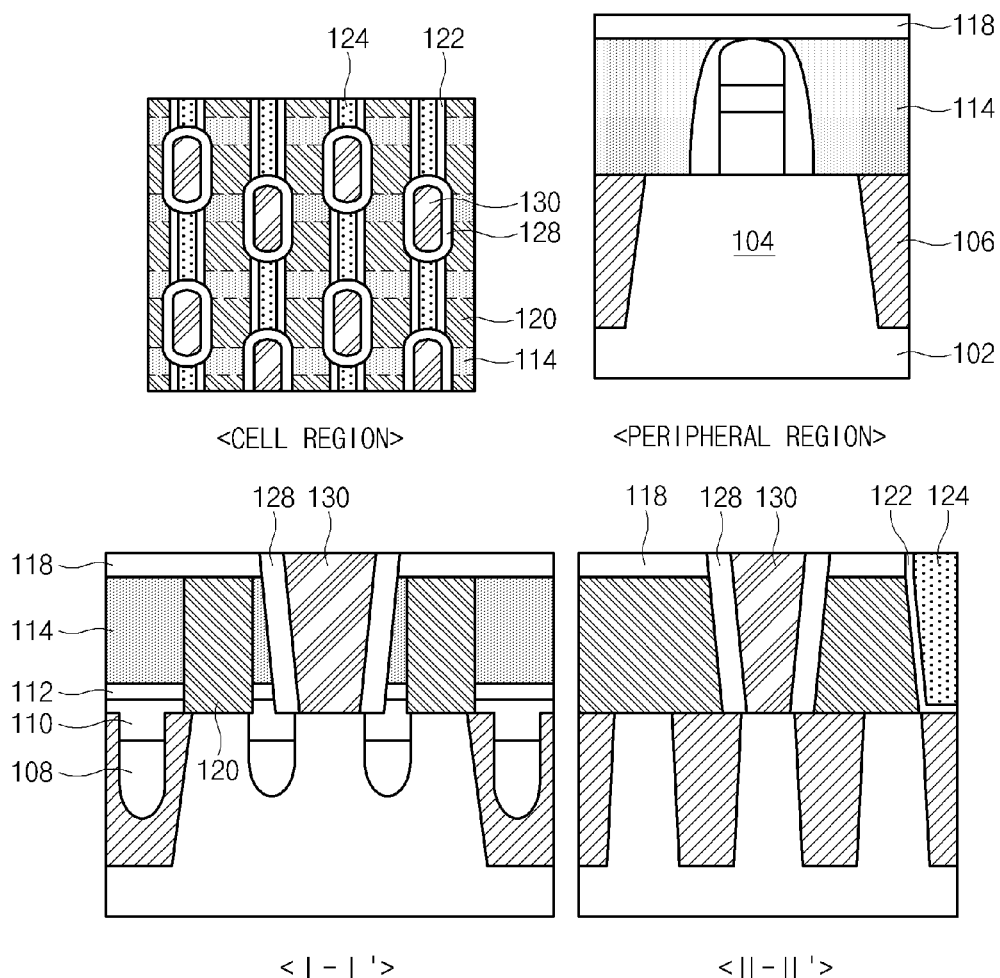

Referring to FIG. 6, a spacer 128 is formed at the sidewalls of the bit line contact hole 126. In this case, the spacer 128 is formed to be thicker than a fourth insulation film 122, and may include a nitride film. Thereafter, a conductive material 126 is buried with a conductive material and is then planarized, so that a bit line contact (BLC) is formed. In this case, the planarization process is performed so that the first hard mask film 118 is exposed and remains to have a thickness of 100 Å or more. There is a difference in height (i.e., a step height) between the BLC 130 and the SNC 120, so that the step height can prevent an electrical short between a bit line to be formed on the BLC 130 and the SNC 120. In this case, the SNC 120 and the BLC 130 may be formed of a conductive material such as polysilicon.

Figure 7:
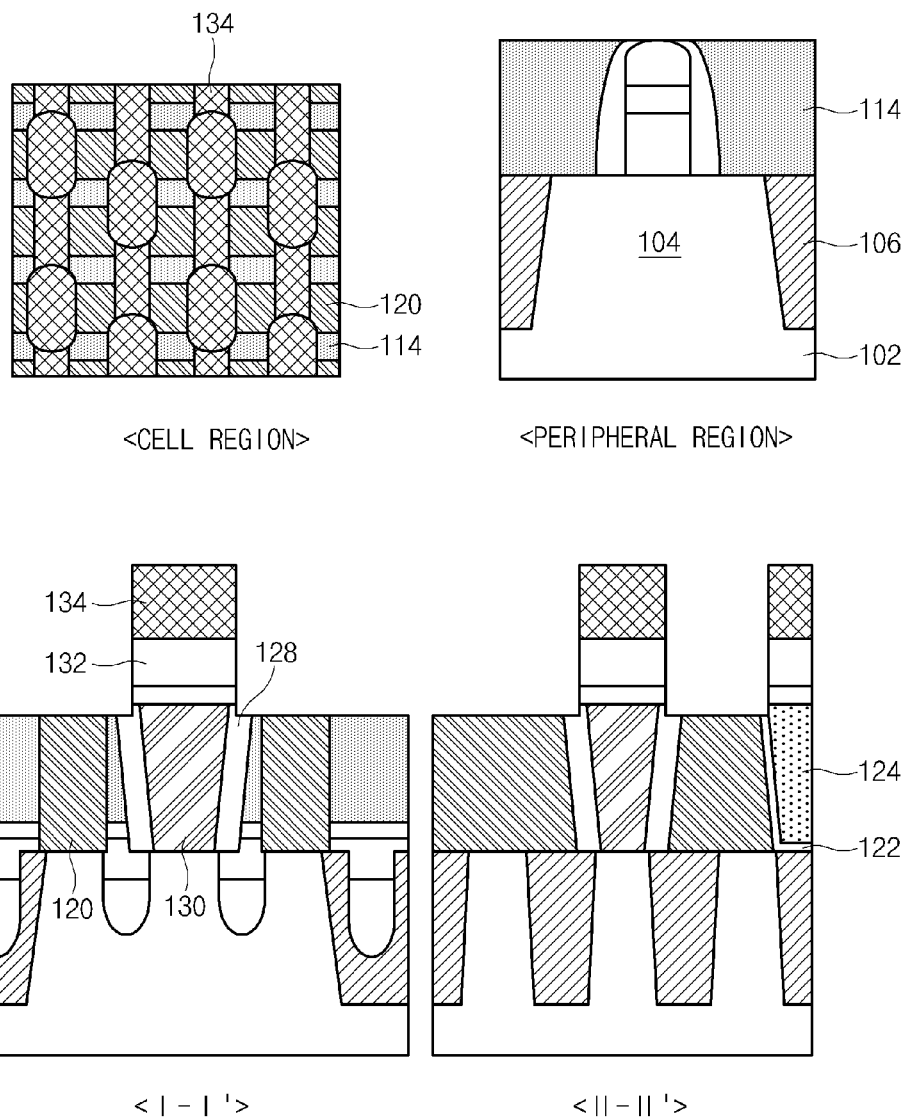

Referring to FIG. 7, a bit line 132 and a bit line hard mask film 134 are formed over the BLC 130. In this case, the bit line 132 is formed in a line pattern orthogonal to the buried gate 108 that performs a word line function, and may include a metal material such as tungsten (W).

Although not shown in the drawings, after the bit line 132 is formed, a contact, a capacitor, etc. connected to the SNC 120 may be additionally formed. In this case, as compared to the process for forming the SNC 120 and the BLC 130, a process for forming the contact and the capacitor may utilize a metal material, In addition, a cross-sectional area of the SNC 120 is larger than that of the source/drain regions formed in the active region 104, so that the environment and condition for deciding electrical characteristics such as an alignment error, an overlap margin, etc. are superior to those of the process for forming the SNC 120 and the BLC 130.

In a process for manufacturing the highly-integrated semiconductor device according to the design rule of 30 nm or less, the active region is small in size. With a small active region there is a high possibility of generating a defect caused by an alignment error, etc. between a contact and the source/drain regions formed in the active region. As described above, a method for manufacturing a semiconductor device according to an embodiment of the present invention exposes the source/drain regions of the active region 104 coupled to the SNC 120 during the formation of the SNC 120, so that junction resistance between the SNC 120 and the source/drain regions can be reduced. In addition, an etch process for forming a line pattern is performed in a crossing direction, and the region to be exposed by the etch process when the source/drain regions are exposed has a large width. This allows a larger fabrication margin than that of the process for forming the contact hole pattern. In order to form the island-type SNC 120, the line-pattern conductive layer is etched using a crossing-directional line pattern, so that a fabrication margin can be increased as compared to the process for forming the contact hole pattern. In conclusion, a method for manufacturing a semiconductor device according to an embodiment of the present invention can reduce junction resistance between the SNC and the source/drain regions.

When forming the BLC and the SNC in the semiconductor device, the present invention forms the SNC after exposing all of the connectable active regions. When forming the SNC, the present invention performs the etch process for a line pattern instead of a hole pattern, so that a margin of the etch process is increased. As a result, there arise electrical shortcomings between a contact and an active region, for example, poor contact, increased resistance, etc.

According to the related art, when forming a contact hole for forming the BLC and the SNC, an active region may be unexpectedly damaged so that it is necessary for a junction area of the source/drain regions to be formed deep. In contrast, according to the present invention, the damage of an active region can be reduced when the active region is exposed to form a contact, so that a junction of the source/drain regions may be formed to have a small thickness. As the junction depth is reduced, the reduced junction can prevent a short channel effect from being generated.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for manufacturing a semiconductor device comprising:
   providing a substrate having a buried gate;
   forming an insulating pattern over the buried gate;
   forming a storage node contact having a line type at a first side of the insulating pattern in parallel to the insulating pattern;
   forming an insulating filling pattern having a line type in perpendicular to the storage node contact, thus dividing the storage node contact; and
   removing only a portion of the insulating filling pattern and the storage node contact thus forming a bit line contact hole.

2. The method of claim 1,
   wherein the insulating filling pattern expands over an active region and a device isolation region in perpendicular to the buried gate.

3. The method of claim 2, the method further comprising:
   forming a conductive filling pattern in the bit line contact hole to obtain a bit line contact pattern.

4. The method of claim 1, wherein an active region of the substrate includes a drain region and a source region at the first and second sides of the buried gate respectively, and the insulating pattern defines the drain and the source regions.

5. The method of claim 4, wherein the active region is arranged angled to the insulating pattern so that the insulating pattern can define the drain and the source regions.

6. The method of claim 1, wherein the bit line contact hole has an island type, a critical dimension of the bit line contact hole being larger than a critical dimension of the insulating filling pattern.

* * * * *